(12) United States Patent
Jiang et al.

(10) Patent No.: US 12,507,350 B2
(45) Date of Patent: Dec. 23, 2025

(54) MANUFACTURING COMPONENT CARRIER WITH CAVITY BY TRIMMING POORLY ADHESIVE STRUCTURE BEFORE REMOVING STACK MATERIAL

(71) Applicant: AT&S Austria Technologie & Systemtechnik Aktiengesellschaft, Leoben (AT)

(72) Inventors: Jeffrey Jiang, Chongqing (CN); Allen Zhao, Chongqing (CN); Artan Baftiri, Chongqing (CN)

(73) Assignee: AT&S Austria Technologie & Systemtechnik Aktiengesellschaft, Loeben (AT)

(*) Notice: Subject to any disclaimer, the term of this patent is extended or adjusted under 35 U.S.C. 154(b) by 565 days.

(21) Appl. No.: 17/817,003

(22) Filed: Aug. 2, 2022

(65) Prior Publication Data
US 2023/0041145 A1 Feb. 9, 2023

(30) Foreign Application Priority Data
Aug. 4, 2021 (CN) .......................... 202110893374.0

(51) Int. Cl.
*H05K 3/46* (2006.01)
*H05K 1/02* (2006.01)
(Continued)

(52) U.S. Cl.
CPC ......... *H05K 3/4644* (2013.01); *H05K 1/0237* (2013.01); *H05K 1/115* (2013.01);
(Continued)

(58) Field of Classification Search
CPC .... H05K 3/4644; H05K 1/0237; H05K 1/115; H05K 3/0026; H05K 3/30; H05K 3/4611
See application file for complete search history.

(56) References Cited

U.S. PATENT DOCUMENTS 8,519,270 B2 * 8/2013 Chang ................. H05K 3/4697
174/250
10,039,184 B2 * 7/2018 Wu ........................ H05K 1/111
(Continued)

FOREIGN PATENT DOCUMENTS

EP 1802183 A2 6/2007
EP 3349553 A1 7/2018
(Continued)

OTHER PUBLICATIONS

Zimmer, R.; Partial European Search Report in application No. EP 22188141; pp. 1-17; Jan. 2, 2023, European Patent Office, 80298, Munich, Germany.
(Continued)

*Primary Examiner* — Alonzo Chambliss
(74) *Attorney, Agent, or Firm* — Robert A. Blaha; Smith Tempel Blaha LLC

(57) ABSTRACT

A method of manufacturing a component carrier includes forming a poorly adhesive structure on at least one layer structure, thereafter removing part of the poorly adhesive structure to thereby define a lateral limit of the poorly adhesive structure, thereafter attaching at least one further layer structure to the at least one layer structure and to the poorly adhesive structure, and forming a cavity by removing material of the at least one further layer structure above the poorly adhesive structure.

19 Claims, 9 Drawing Sheets

(51) Int. Cl.
*H05K 1/11* (2006.01)
*H05K 3/00* (2006.01)
*H05K 3/30* (2006.01)

(52) U.S. Cl.
CPC ............ *H05K 3/0026* (2013.01); *H05K 3/30* (2013.01); *H05K 3/4611* (2013.01); *H05K 2203/107* (2013.01)

(56) References Cited

U.S. PATENT DOCUMENTS

| | | | |
|---|---|---|---|
| 10,064,292 B2* | 8/2018 | Pen | H05K 1/115 |
| 10,321,560 B2* | 6/2019 | Yu | H05K 1/0278 |
| 2013/0299223 A1* | 11/2013 | Yoo | H05K 3/4697 174/250 |
| 2015/0364432 A1 | 12/2015 | Chung et al. | |
| 2017/0048985 A1 | 2/2017 | Knox et al. | |
| 2021/0135346 A1 | 5/2021 | Li et al. | |

FOREIGN PATENT DOCUMENTS

| | | |
|---|---|---|
| EP | 3840547 A1 | 6/2021 |
| KR | 20130068656 A | 6/2013 |
| TW | 201620347 A | 6/2016 |
| WO | 2009050974 A1 | 4/2009 |
| WO | 2015113088 A1 | 8/2015 |
| WO | 2020087898 A1 | 5/2020 |

OTHER PUBLICATIONS

Zimmer, R.; Extended European Search Report in application No. EP 22188141; pp. 1-17; May 3, 2023, European Patent Office, 80298, Munich, Germany.

* cited by examiner

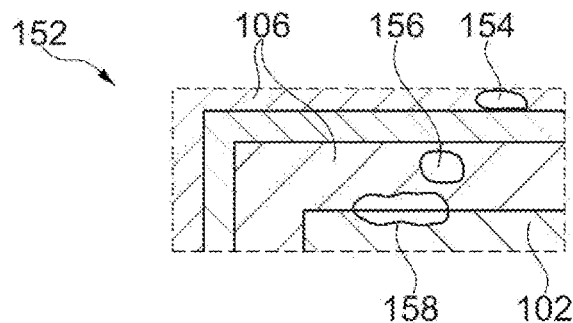
Fig. 18
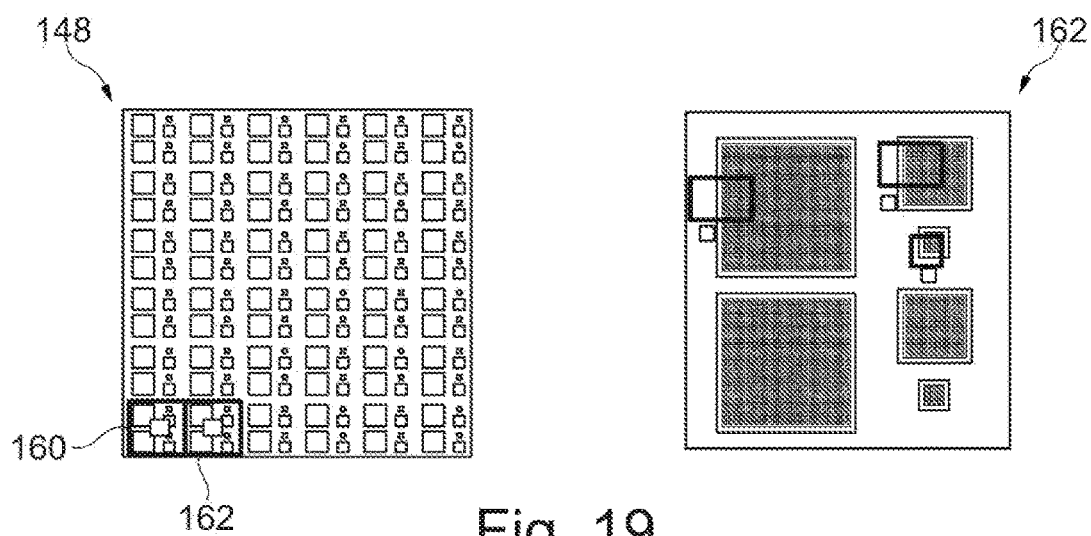
Fig. 19
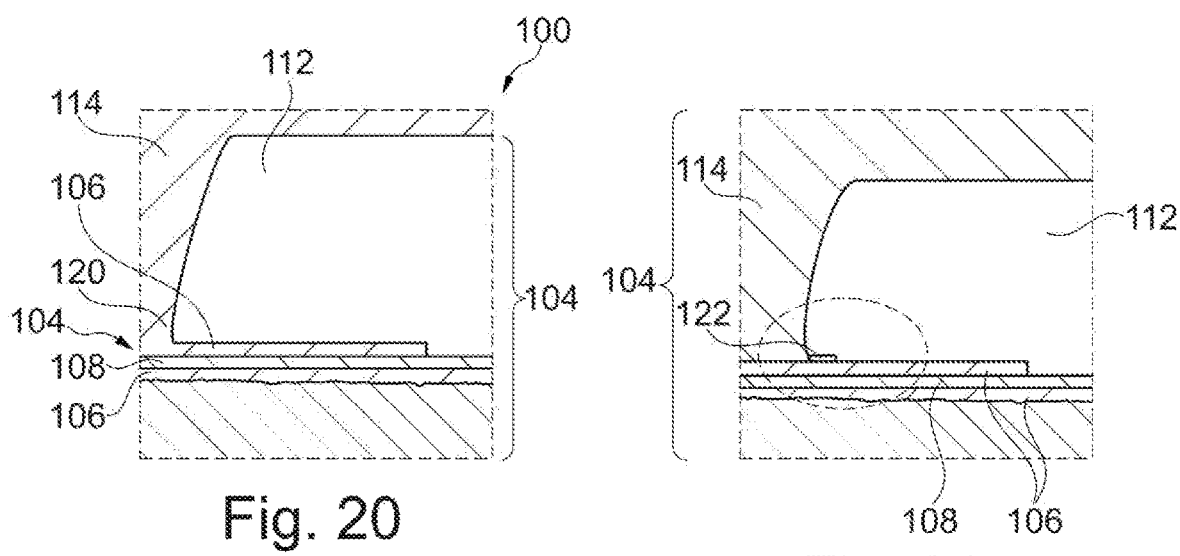
Fig. 20
Fig. 21

MANUFACTURING COMPONENT CARRIER WITH CAVITY BY TRIMMING POORLY ADHESIVE STRUCTURE BEFORE REMOVING STACK MATERIAL

CROSS-REFERENCE TO RELATED APPLICATIONS

This application claims the benefit of the filing date of Chinese Patent Application No. 202110893374.0, filed Aug. 4, 2021, the disclosure of which is hereby incorporated herein by reference.

TECHNICAL FIELD

Embodiments of the present invention relate to a component carrier and a method of manufacturing a component carrier.

BACKGROUND ART

In the context of growing product functionalities of component carriers equipped with one or more components and increasing miniaturization of such components as well as a rising number of components to be connected to the component carriers such as printed circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

Conventional approaches of forming cavities in laminated layer stacks, for instance for embedding a component, may lack accuracy, in particular in view of the continuing trend of miniaturization requiring a higher and higher precision.

SUMMARY

There may be a need to form a cavity in a component carrier with high spatial accuracy.

According to an exemplary embodiment of the invention, a method of manufacturing a component carrier is provided, wherein the method comprises forming a poorly adhesive structure on at least one layer structure (such as at least one electrically conductive layer structure and/or at least one electrically insulating layer structure), thereafter removing part of the poorly adhesive structure to thereby define a lateral limit of the poorly adhesive structure, thereafter attaching at least one further layer structure to the at least one layer structure and to the poorly adhesive structure, and forming a cavity by removing material of the at least one further layer structure above the poorly adhesive structure.

According to another exemplary embodiment of the invention, a component carrier is provided which comprises a stack comprising at least one electrically conductive layer structure and at least one electrically insulating layer structure, and a cavity formed in the stack without lateral undercut exceeding 5 µm (in particular having no lateral undercut at all, or having a lateral undercut with a lateral extension of not more than 5 µm) along an entire circumference of a bottom of the cavity.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "cavity" may particularly denote a hole in the component carrier, in particular a blind hole or a (for instance stepped) through hole. A cavity may be delimited at least partially by a bottom portion of the component carrier and/or may be delimited at least partially by one or more sidewalls of the component carrier, in particular fully circumferentially. It is also possible that the cavity delimited by the component carrier has an at least partially open bottom and/or an at least partially open side.

In the context of the present application, the term "poorly adhesive structure" may particularly denote a physical structure made of material which has the property of not or only extremely weakly adhering to stack material of a component carrier such as a printed circuit board. In particular, such a stack material may comprise copper and resin (in particular epoxy resin), optionally comprising reinforcing particles such as glass fiber. The poorly adhesive structure may be embodied as a release layer at which layer structures of the stack above and beneath the release layer may be separated without the need of overcoming adhesive forces. For instance, such a poorly adhesive structure may be made of Teflon®, a waxy material or a suitable varnish. Teflon® is a registered mark of The Chemours Company FC LLC of Wilmington, Delaware, U.S.A. Examples for poorly adhesive materials which can be implemented according to exemplary embodiments of the invention are disclosed in WO 2015/113088 A1 (which is incorporated by reference in its entirety in the disclosure of the present application).

According to an exemplary embodiment of the invention, a manufacturing architecture for component carriers is provided which allows to form a cavity in a preform of a component carrier with highest accuracy. After having applied a poorly adhesive structure, such as a release layer, on a layer stack, the poorly adhesive structure may be trimmed at least at one lateral edge thereof by a trimming process having a spatial accuracy exceeding a spatial accuracy of a process of applying the poorly adhesive structure. For instance, laser trimming may be carried out spatially much more precise than applying a poorly adhesive structure by printing or dispensing. After attaching one or more layer structures on the stack and on the applied and trimmed poorly adhesive structure, a cavity may be formed by selectively removing a piece of material of the one or more additional layer structures on top of the trimmed poorly adhesive structure. In view of the poorly adhesive property of the poorly adhesive structure, the circumferentially separated piece of material may simply be taken out from the rest of the cavity. Advantageously, also the separation of said piece may be spatially defined by a process—preferably laser processing—which is spatially more precise than the process of applying the poorly adhesive structure, for instance by printing or dispensing. As a result, a cavity with spatially highly accurate dimension and precision may be obtained allowing to form a component carrier with excellent spatial definition. In particular, this may form a proper basis of a spatially accurate component embedding process and/or a miniaturization of the component carrier. Furthermore, undesired excessive pockets or undercuts at a lateral edge of a cavity, which may conventionally remain at least partially filled with poorly adhesive material, may be reliably prevented to exceed 5 µm. Thus, no or only very small undercuts may occur. This may also improve the mechanical integrity of the component carrier and may avoid undesired phenomena such as delamination and/or limited reliability. As a result, the yield of manufacturing component carriers may be improved.

More specifically, a gist of an exemplary embodiment is the execution of laser trimming of release ink directly after release ink printing. Such a process flow may improve registration and quality of a cutting process of cutting out the above-mentioned piece of stack material for cavity formation.

In the following, further exemplary embodiments of the component carrier and the method will be explained.

In an embodiment, the method comprises forming the poorly adhesive structure by printing, in particular by screen printing or inkjet printing. Additionally or alternatively, it is for example also possible to form the poorly adhesive structure by coating or laminating. More generally, any method of applying an ink may be used for forming the poorly adhesive structure. Various methods used for applying an ink-type poorly adhesive structure have a limited or poor resolution, and the limited or poor resolution of all such methods can be advantageously compensated by using the described laser trimming. Further methods which can be used for applying the poorly adhesive structure besides printing methods (including screen printing, inkjet printing and 3D printing) are coating methods (such as spray coating, dip coating, etc.) and any other dispensing method.

Screen printing may denote a printing technique where a mask is used to transfer poorly adhesive materials such as release ink onto the stack, except in areas made impermeable to the poorly adhesive material, for example by a blocking stencil. A blade may be moved across the screen to fill the open mask apertures with poorly adhesive material. Inkjet printing may denote a printing process that recreates a predefined image by propelling droplets of poorly adhesive ink onto the stack. It is also possible that the poorly adhesive structure is formed by dispensing using a dispenser. Such a dispenser may denote a machine designed to release a specific amount of its content in form of poorly adhesive material to the stack. Although the mentioned printing and dispensing processes are appropriate for applying poorly adhesive material on a stack of a panel or the like on an industrial scale, the spatial accuracy of the applied poorly adhesive material may be insufficient for high precision component carrier applications, such as embedding of tiny semiconductor dies. For example, screen printing may have wide tolerances of about ±150 µm. This shortcoming can be overcome by trimming the applied poorly adhesive material with a trimming process having a higher spatial accuracy than the application process.

In an embodiment, the method comprises forming a functional coating at least part of a surface which delimits the cavity. Correspondingly, the component carrier may comprise a functional coating which coats at least part of a surface which delimits the cavity. In particular, such a coating may be provided to coat at least part of the bottom of the cavity and/or at least part of at least one sidewall of the cavity. For example, such a coating may be a reflective coating (which may reflect electromagnetic radiation such as light), an anti-reflective coating (which may transmit and/or absorb electromagnetic radiation such as light), and/or a solder mask. By such a coating of the cavity, the component carrier may be functionality customized in accordance with a desired application. In particular, at least one sidewall of the cavity may be covered with a functional film.

In an embodiment, the cavity is formed without any lateral undercut at all along an entire circumference of the bottom of the cavity. In another embodiment, the cavity is formed with lateral undercut along at least part of a circumference of the bottom of the cavity, but the lateral undercut is not more than 5 µm, in particular not more than 2 µm. Such a small or even non-existent undercut is the fingerprint of the laser trimming of the poorly adhesive structure. Hence, no undercut—or an undercut above zero but of not more than 5 µm and preferably not more than 2 µm—along all edges of the cavity may be achieved. It may be possible to prevent an excessive undercut along all edges due to the properties of the ink when trimming the ink.

In an embodiment, the method comprises adjusting a size and/or a shape of a lateral undercut along at least part of a circumference of the bottom of the cavity by correspondingly adjusting the process of removing part of the poorly adhesive structure. Hence, the ink trimming process can be also used to define the depth of an undercut. With laser trimming very smooth copper surfaces will be obtained (in particular with a surface roughness of not more than 1 µm, in particular of not more than 0.5 µm, more particularly of not more than 0.2 µm). Thus, the adhesion of the resin (as well as the surface finishing) may be limited, and an undercut after etching (release ink stripping) may occur. The depth of the undercut can then be adjusted (or tuned) by the amount of trimmed ink. By filling the undercut with resin or any other functional film, it may be advantageously possible to use the undercut as an additional functional feature of the component carrier, as for instance for shielding purposes.

In an embodiment, a surface roughness Rz of a side wall and/or a bottom of the cavity is not more than 0.5 µm, in particular not more than 0.2 µm. Such smooth side and/or bottom walls may be the result of forming the cavity by laser cutting. Smooth side walls of the cavity may ensure a precise definition of the cavity size, may improve the mechanical integrity of the component carrier, and may have technical advantages in terms of high-frequency applications (for instance improving signal quality in view of the skin effect, according to which a high frequency signal propagates substantially only within a thin skin of an electrically conductive material delimiting at least part of the cavity). In particular, such very smooth side walls may be advantageous if a solder mask is applied.

In an embodiment, the component carrier is used for high-frequency applications above 1 GHz, in particular above 10 GHz. In particular for such high frequencies, signal transmission is particularly sensitive to surface roughness caused artefacts in view of the skin effect. The high smoothness of laser cutting-defined cavities of component carriers according to exemplary embodiments of the invention allows low loss signal transmission even with such high-frequency values.

In an embodiment, the cavity is configured as waveguide for radio frequency signals. In the context of the present application, the term "waveguide" may particularly denote a structure that guides waves, such as electromagnetic waves, with reduced loss of energy by restricting the transmission of energy to a limited number of directions, in particular, to one direction. Without the physical constraint of a waveguide, wave amplitudes decrease more quickly as they expand into the three-dimensional space. For instance, a waveguide may be a hollow conductive recess in a layer stack of a component carrier which may be used to carry high frequency radio waves. For instance, a cross-section of a metallized recess functioning as wave-guide may be rectangular or circular. For instance, a signal may be coupled with a waveguide using a stripline, i.e., a transverse electromagnetic transmission line such as a planar transmission line. If the cavity is used for high frequency applications, the signal integrity will be significantly enhanced due to the absence of an undercut or at least the absence of an excessive undercut. Additionally, the sidewall of the cavity may be very smooth (due to the laser cutting), which—due to the skin effect—leads to better signal transmission.

Furthermore, release ink residues may lead to migration of foreign materials, which additionally lowers the reliability of the whole build-up. With respect to power applications, residues are prone to migrate (the more power applied, the more migration occurs), which has also an impact on the lifetime of the PCB. By reducing or even eliminating release ink residues by trimming, the RF performance may be further improved.

In an embodiment, the method comprises removing part of the poorly adhesive structure by laser trimming. Highly advantageously, laser trimming for removing excessive poorly adhesive material at a lateral end of an applied poorly adhesive structure may have such a high spatial accuracy that, as a result, also the accuracy of the formed cavity may be highly precise. For laser trimming, a laser beam may be directed along an edge of the previously applied poorly adhesive structure to thereby precisely define an outline of the poorly adhesive structure, in particular in accordance with a predefined specification. For example, laser trimming has small tolerances of about ±10 μm.

In an alternative embodiment, the method comprises removing part of the poorly adhesive structure by forming a patterned mask on part of the poorly adhesive structure and on part of the stack, and subsequently etching (preferably by dry etching, or additionally or alternatively by wet etching) part of the poorly adhesive structure through one or more recesses in the mask. Thus, the trimming and definition of the outline of the poorly adhesive structure may be carried out using a lithographic mask process. For this purpose, a mask may be applied on one or more portions of a previously applied poorly adhesive structure, keeping excessive lateral portions (in particular an entire outline) of the previously applied poorly adhesive structure uncovered or exposed. Thereafter, exposed portions of the applied poorly adhesive structure extending beyond the mask may be selectively removed by etching, in particular by dry etching. For example, a dry etching technique which may be implemented according to exemplary embodiments of the invention may be plasma etching, in particular deep reactive ion etching.

In an embodiment, the method comprises forming the cavity without—or at least without excessive—lateral undercut along an entire circumference of a bottom of the cavity. Conventionally and in view of large tolerances of medium application technologies, the lateral extension of poorly adhesive structures for forming cavities usually exceeds the spatial limits of a piece cut out of one or more layer structures on top of the poorly adhesive structure, which results in pronounced lateral pockets—also denoted as undercuts—at bottom corners of the cavities. Such excessive undercuts may be a cause for undesired phenomena such as delamination and may weaken the mechanical integrity of the component carrier as a whole. According to an exemplary embodiment of the invention, such undercuts may be avoided at least largely by the high accuracy of the (preferably laser) trimming process. Consequently, a substantially 90° angle may be formed between a bottom surface and sidewalls of the cavity. This may also improve the reliability of the component carrier.

In an embodiment, the method comprises removing material of the at least one further layer structure by laser cutting. In particular, the method may comprise forming a circumferential cutting trench in the layer body extending up to the release layer to thereby separate the piece from a rest of the layer body. Cutting said trench may be accomplished preferably by laser drilling, since also this laser process has a high spatial accuracy (for instance tolerances of not more than ±10 μm). An alternative to laser drilling for separating the piece from the rest of the stack is mechanically drilling, which should be carried out with a sufficiently high spatial accuracy.

In an embodiment, the method comprises using at least one of the at least one electrically conductive layer structure of the stack as a stop layer during the laser cutting. By cutting out the piece of the stack (which creates the cavity after removing this piece) by laser cutting, a relatively large thermal impact on the stack may occur. In particular, excessive cutting into the stack below the poorly adhesive structure should be avoided in order to avoid vertical undercut. For stopping the laser cutting process in a vertical direction precisely at the target's position, the anyway present at least one electrically conductive layer structure of the stack may include a section located at a desired bottom of the cavity directly next to the desired lateral edge of the cavity. When the laser beam reaches said electrically conductive layer structure, preferably made of copper, the laser cutting process stops, since laser cutting through metallic material is significantly less efficient than laser cutting through dielectric material. Hence, an electrically conductive layer structure may have a double function, i.e., the electrically conductive layer structure may serve as a laser stop and may have an electronic function in terms of the functionality of the component carrier being manufactured.

In an embodiment, the method comprises removing the material in form of a material piece by forming a circumferential trench in the at least one further layer structure around the material piece which is delimited at a bottom side by the poorly adhesive structure. Forming the circumferential trench may be carried out preferably by laser cutting, or alternatively by mechanically cutting or routing.

In an embodiment, the method comprises at least partially delimiting a bottom of the cavity by at least one of the at least one electrically conductive layer structure of the stack. Correspondingly, the component carrier may have a bottom of the cavity being at least partially delimited by at least one of the at least one electrically conductive layer structure of the stack. Apart from the fact that such an electrically conductive layer structure located at the bottom of the cavity can function as a laser stop layer (as described above), said electrically conductive layer structure defining a bottom of the cavity may also have an additional electronic and/or thermal function. Since copper (or other appropriate metal), as a preferred material for an electrically conductive layer structure has a high electric conductivity, it may function for instance as an electrically conductive trace for connecting a pad of an electronic component (such as a semiconductor chip) to be embedded in the cavity. Since the mentioned materials of the electrically conductive layer structure may also have a high thermal conductivity, they may also be configured for contributing to the removal of heat out of the component carrier during operation thereof.

In an embodiment, the method comprises removing the poorly adhesive structure, in particular the entire poorly adhesive structure, after forming the cavity. Any undesired tendencies of delamination may be reliably suppressed when the entire poorly adhesive structure is removed from the readily manufactured component carrier. The latter may therefore have a high mechanical integrity.

Alternatively, a bottom of the cavity may remain at least partially covered with a poorly adhesive structure. In such an embodiment, at least part of the poorly adhesive structure may form part of the readily manufactured component carrier.

In an embodiment, the method comprises using the same registration fiducials for registration for removing part of the poorly adhesive structure, and for registration for separating material of the at least one further layer structure to be removed. In other words, the same fiducials may be used for registration or alignment in terms of laser trimming and in terms of cavity cutting. Highly advantageously, the same registration fiducials or alignment markers may be used both for the process of trimming the applied poorly adjacent structure and for the circumferential cut-out of the at least one further layer structure for removing a piece which then leaves behind the desired cavity. For instance, such registration fiducials may be through holes, blind holes, copper pads, or any other kind of mechanical or optical markings on the stack. This may allow a manufacturing apparatus to precisely define a spatial correlation between the preform of the component carrier (for instance a PCB panel) and manufacturing tools, such as laser trimming and/or cutting tools. When the same registration fiducials are used for defining the spatial limits of the trimmed poorly adhesive structure and for defining a cutting trajectory for removing the cavity-related piece of stack material, registration inaccuracies of both processes do not add, but only a single registration tolerance occurs. This further improves the spatial accuracy of the manufactured cavity.

In an embodiment, the method comprises adjusting a roughness Rz (in particular of an exposed electrically conductive layer structure) along at least part of a circumference of a bottom surface of the cavity to be lower than a roughness Rz (in particular of an exposed electrically conductive layer structure) in a central portion of the bottom surface of the cavity. Correspondingly, the component carrier may have a roughness Rz (in particular of an exposed electrically conductive layer structure) along this part of a circumference of a bottom surface of the cavity which is lower than a roughness Rz (in particular of an exposed electrically conductive layer structure) in a central portion of the bottom surface of the cavity. In the context of the present application, the term "roughness Rz" may particularly denote a measure for the roughness which can be determined when a reference length is sampled from a roughness curve in a direction of a mean line, and may denote the distance between the top profile peak line and the bottom profile valley line on this sampled portion as measured in the longitudinal direction of the roughness curve (for instance, Rz may be determined by averaging over five individual measuring paths). For example, the measurement or determination of roughness Rz may be carried out according to DIN EN ISO 4287:1984. In a central portion of the bottom of the recessed stack delimiting the cavity a copper surface may be uninfluenced by the cavity formation process, preferably carried out by laser trimming and/or laser cutting. Thus, the copper roughness in this central region may correspond to the copper roughness of a copper foil used as semifinished product for manufacturing the electrically conductive layer structure exposed at the bottom of the cavity. In contrast to this, a copper surface at an exterior perimeter of the bottom of the cavity delimited by the stack may be influenced by a laser trimming process for redefining an outline of a poorly adhesive structure and/or by a laser cutting process for removing a material piece above the poorly adhesive structure from the stack. For example, said annular metallic surface may also function as a laser stop layer. In view of the close spatial vicinity of such a copper surface and a laser beam used during laser trimming and/or laser cutting, copper material corresponding to said copper surface may be melted during laser trimming and/or laser cutting, and may resolidify thereafter. As a result, said copper surface may have a smoother surface than before melting and re-solidifying, and may thus have a lower roughness than another copper surface at the central portion of the cavity.

In an embodiment, the method comprises forming the poorly adhesive structure as a poorly adhesive layer with a planar upper surface on the stack. More specifically, at least an upper main surface of the poorly adhesive structure may be completely planar, whereas a lower main surface may be for example only substantially planar while balancing out a surface profile (for instance of a patterned copper layer) at a bottom of the cavity. A layer-type poorly adhesive structure, which may form a release layer, may properly define a substantially planar bottom portion of the cavity. This may properly prepare the cavity for a subsequent assembly of a component, in particular an electronic component, for embedding the component in the component carrier.

In an embodiment, the method comprises removing part of the poorly adhesive structure at least at two opposing sides of, in particular along an entire circumference of, the poorly adhesive structure. By trimming the poorly adhesive structure in particular along the entire perimeter thereof, the entire outline of the cavity may be precisely redefined for at least partially compensating inaccuracies of an application process of applying the poorly adhesive structure. Hence, a high accuracy of cavity definition may be achieved over the entire extension of the cavity.

In an embodiment, the method comprises embedding a component in the formed cavity. For this purpose, the component may be placed in the formed cavity. If the component has pads, the pads may be connected in an electrically conductive way with exposed surface sections of the at least one electrically conductive layer structure of the stack. The embedded component may be glued in place in the cavity by inserting a flowable adhesive into gaps between the component and the stack. Additionally or alternatively, gluing the embedded component in place in the cavity may also be accomplished by lamination of an at least partially uncured electrically insulating layer structure (for instance a prepreg sheet or resin sheet) on the top side of the component and the stack.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as a component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular materials coated with supra-conductive material or conductive polymers, such as graphene or poly (3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semi-conductor materials such as silicon carbide (SiC), gallium arsenide (GaAs), gallium nitride (GaN), gallium oxide (Ga$_2$O$_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. The magnetic element can be composed by magnetic particles distributed in a polymer matrix. Such materials may be provided as a printable paste or as sheet materials in B-stage and C-stage form. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the invention are apparent from the examples of embodiment to be described hereinafter and are explained with reference to these examples of embodiment.

BRIEF DESCRIPTION OF THE DRAWINGS

FIG. 15, FIG. 16, FIG. 17, and FIG. 18 illustrate various plan views of parts of a panel used for manufacturing component carriers according to an exemplary embodiment of the invention.

FIG. 19 illustrates part of a panel and a detail thereof used for manufacturing component carriers according to an exemplary embodiment of the invention.

FIG. 20 illustrates a cross-sectional view of a component carrier according to exemplary embodiment of the invention.

FIG. 21 illustrates a conventional component carrier.

DETAILED DESCRIPTION OF ILLUSTRATED EMBODIMENTS

Figure 1:
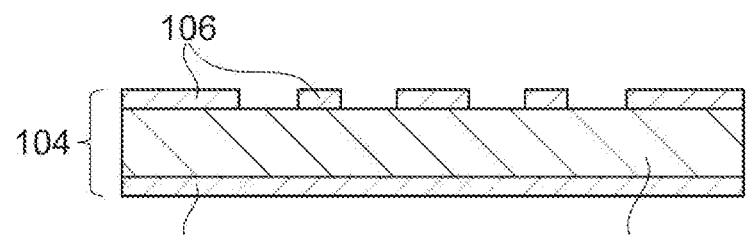
FIG. 1, FIG. 2, FIG. 3, FIG. 4, FIG. 5, FIG. 6 and FIG. 7 illustrate cross-sectional views of structures obtained during carrying out a method of manufacturing a component carrier, shown in FIG. 7, according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

Conventionally, formation of a poorly adhesive release layer on a layer stack for defining an extension of a cavity formed in the stack after a further build-up is carried out by screen printing. However, screen printing may suffer from relatively large inaccuracies, for instance of about 100 µm or even 150 µm. This may make it difficult to ensure that there is no or at least no significant release ink undercut residue after cutting.

According to an exemplary embodiment of the invention, spatial uncertainties when forming a cavity in a layer stack may be significantly reduced by trimming a previously applied poorly adhesive release layer for precisely defining where a poorly adhesive release layer ends. More specifically, a definition where a poorly adhesive release layer ends may be achieved by removing portions of the poorly adhesive release layer where it is not desired according to a predefined specification. According to a preferred embodiment of the invention, release layer trimming may be carried out by selectively removing portions at an exterior edge of an applied poorly adhesive release layer by burning away release layer material by a spatially strictly confined laser beam. Since a spatial control of a laser beam can be carried out with very high accuracy, this leads to a high spatial accuracy of the spatial extension of the poorly adhesive release layer and consequently of the correspondingly formed cavity.

Consequently, a preferred embodiment of the invention manufactures a component carrier by forming a poorly adhesive release layer on a stack (for instance by inkjet printing or screen printing), defining its limits by removing part of the release layer material (preferably by laser trimming, alternatively by a mask and etching process), connecting at least one further layer structure to the stack and the trimmed release layer, and forming the cavity by cutting out (preferably by laser cutting) a material piece above the release layer (preferably without forming an undercut, which becomes possible due to the high accuracy of the laser processes). Descriptively speaking, exemplary embodiments of the invention execute release ink trimming for forming a cavity in a laminated layer substrate. Highly advantageously, exemplary embodiments of the invention may eliminate completely any release ink residues in the readily manufactured component carrier, preferably a printed circuit board (PCB) or an integrated circuit (IC) substrate. This may be obtained by laser trimming the release ink after its application to the layer stack. Exemplary embodiments of the invention allow a significantly improved (in particular maximized) control of release ink location and elimination of risks of an excessive undercut.

As a further benefit of the concept of laser trimming, yield and quality of the manufactured component carriers may be improved.

Exemplary applications of exemplary embodiments of the invention are component carriers having a cavity, for instance component carriers having one or more embedded components (in particular embedding one or more double sided components, i.e., components having pads on both opposing main surfaces thereof). Another application for component carriers with a cavity is high-frequency component carriers having one or more hollow or dielectrically filled cavities functioning as waveguides.

Especially for RF applications, it may be advantageous that the side walls are very smooth to ensure best signal transmission. A pronounced undercut may lower the signal integrity. Furthermore, foreign material, such as release ink residues, may induce material migration to an elevated extent which may be disturbing for power applications. Thus, a smooth sidewall of the cavity formed by laser processing may be advantageous.

Further advantageously, an additional functional layer may be applied on the bottom and/or on at least one side wall of the cavity. The functional layer can be for instance a reflective or antireflective coating (for instance to improve signal quality of inserted sensors like cameras or the like), a shielding, or a layer having the ability to change the refraction index of incoming light or any other functionality. More generally, such a functional layer may be a functional coating of any shape.

Advantageously, it may be possible to trim the release ink applied by screen printing on the same layer as the cavity layer. In view of laser trimming, an improvement of yield and reliability may be achieved by ensuring that there is substantially no ink residue after the cavity cut, and in particular substantially no ink undercut. The absence of an excessive ink undercut combined with the decreased distance of the ink to a stop copper edge may ensure a proper mechanical integrity of the component carrier.

In an embodiment, it is possible to print release layer ink on a stack and laminate one or more further layer structures thereon. Thereafter, it may be possible to use routing or laser processing to form the cavity by removing the cap and thereafter the release layer ink. Because the screen printing may worsen alignment of the release layer ink edge, a high accuracy can be obtained by using a laser trimming of the release ink layer edge after the screen printing. As a result, a cavity with accurately defined position and dimensions may be obtained. Hence, by adding a laser trimming process after release layer screen printing, it may be possible to overcome conventional poor accuracy issues from the screen printing, which may show an uneven bleed out. Thus, it may be possible to obtain a very suitable cavity size without any release layer ink residues.

Figure 5:
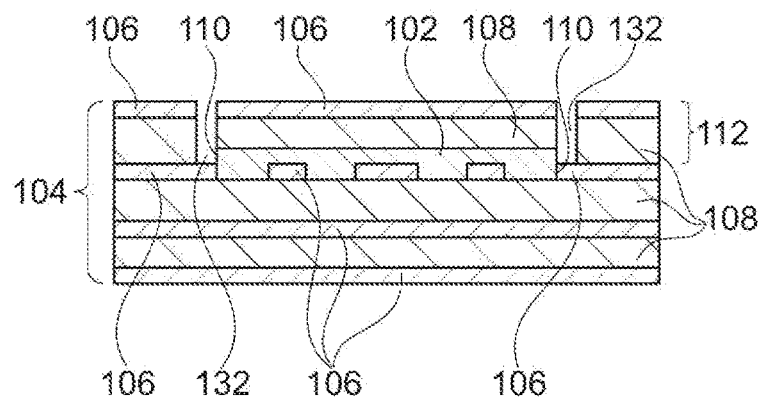
Figure 6:
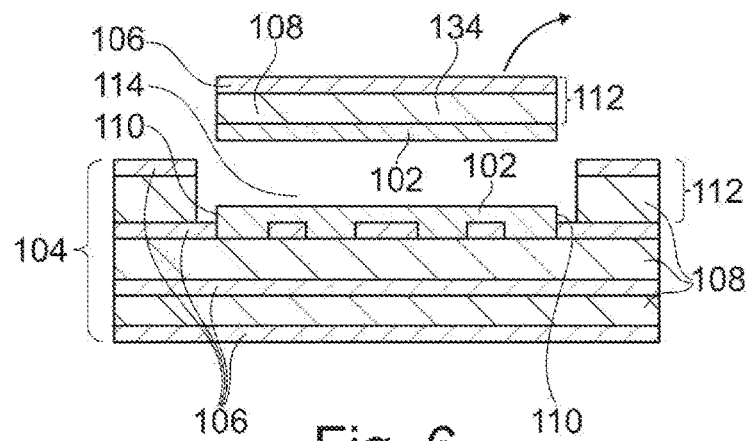
Figure 7:
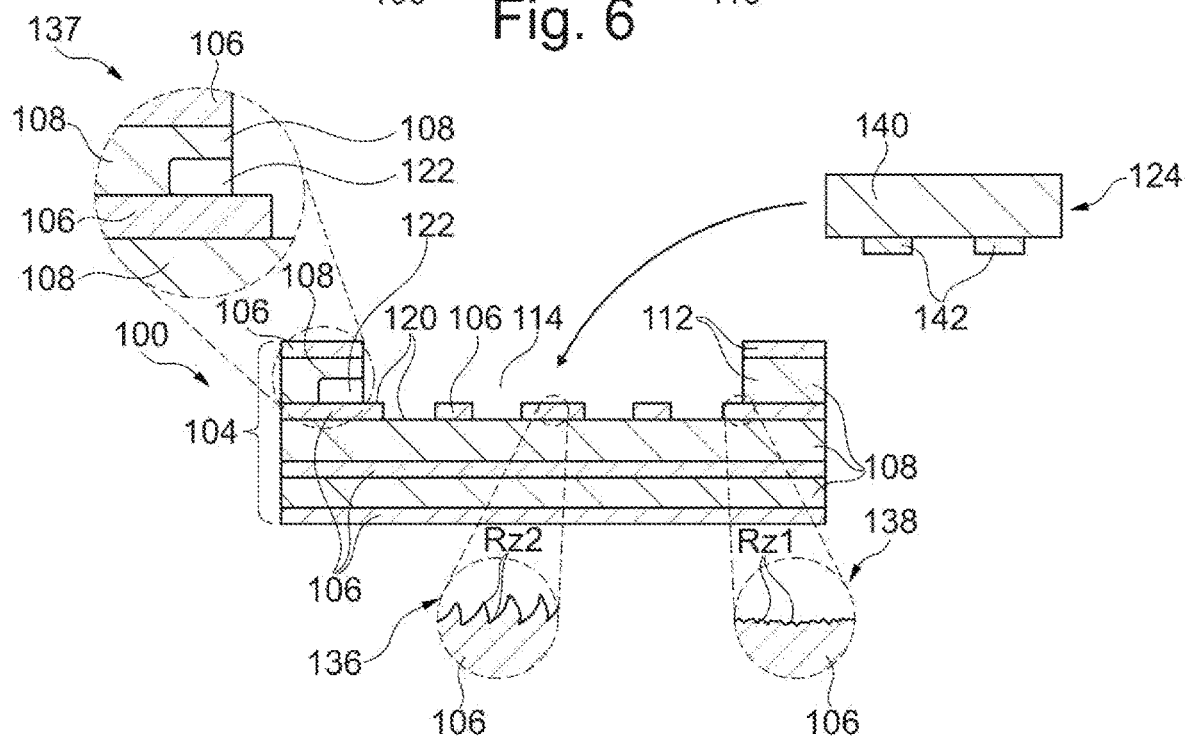

FIG. 1 to FIG. 7 illustrate cross-sectional views of structures obtained during carrying out a method of manufacturing a component carrier 100, shown in FIG. 7, according to an exemplary embodiment of the invention.

Referring to FIG. 1, the manufacturing method starts with a laminate-type stack 104.

More specifically, the laminated layer stack 104 is composed of electrically conductive layer structures 106 and one or more electrically insulating layer structures 108. As shown, the electrically conductive layer structures 106 may comprise patterned or continuous copper foils. Although not shown, the electrically conductive layer structures 106 may further comprise vertical through connections, for example copper filled laser vias which may be created by plating. The one or more electrically insulating layer structures 108 may comprise a respective resin (such as a respective epoxy resin), preferably comprising reinforcing particles therein (for instance glass fibers or glass spheres). For instance, the electrically insulating layer structures 108 may be made of prepreg or FR4.

According to FIG. 1, a central electrically insulating layer structure 108 is covered on a bottom main surface with a continuous copper foil and is covered on an upper main surface with a patterned copper foil. It is possible that the stack 104 shown in FIG. 1 is a fully cured core being cladded with copper on both opposing sides.

Figure 2:
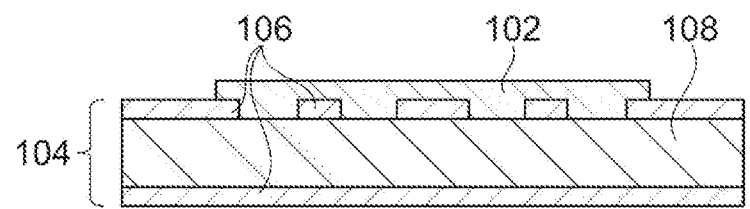

Referring to FIG. 2, a poorly adhesive structure 102, which may also be denoted as release layer, is formed on the stack 104. For example, the poorly adhesive structure 102 may be made of Teflon®, a waxy material or a suitable varnish, or of any other appropriate release ink material. More specifically, poorly adhesive structure 102 is formed partly on the patterned upper electrically conductive layer structure 106 and partly on exposed surface portions of the upper side of the electrically insulating layer structure 108. In the shown embodiment, the poorly adhesive structure 102 is formed by printing, for instance by a screen printing or inkjet printing process having a relatively poor spatial resolution of for example 100 µm to 150 µm. The illustrated poorly adhesive structure 102 is formed as poorly adhesive layer with a planar top side on the stack 104.

Figure 3:
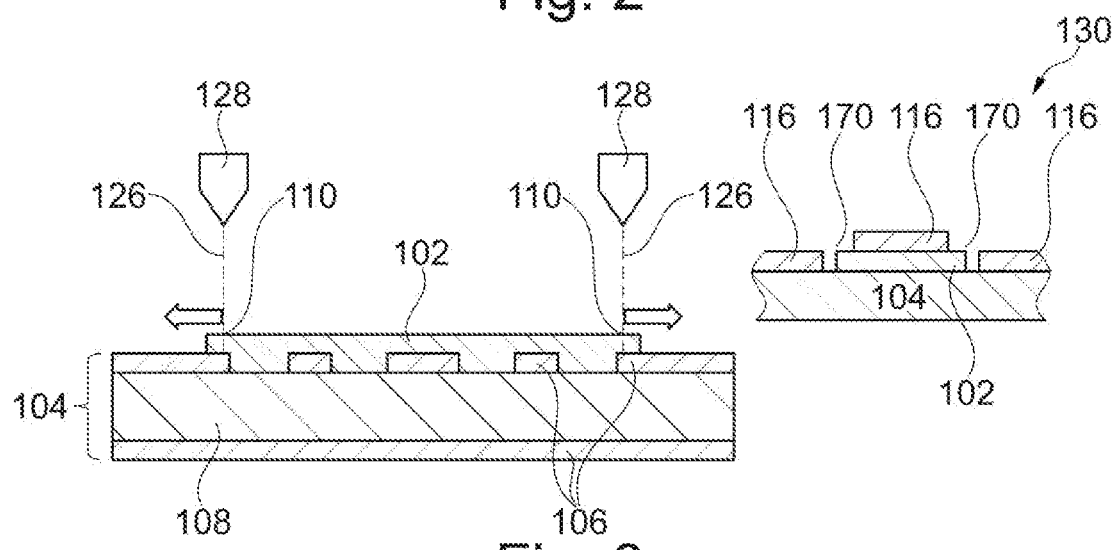

Referring to FIG. 3, the poorly adhesive structure 102 is then made subject to laser trimming to redefine its outline with improved spatial definition.

More specifically, part of the poorly adhesive structure 102 is removed, directly after its application, by irradiating a defined portion on the top side according to FIG. 2 with a laser beam 126 emitted by a movable laser source 128. The laser beam 126 removes part of the poorly adhesive structure 102 due to the high thermal impact of the laser beam 126 on material of the poorly adhesive structure 102. The laser beam 126 can be controlled with very high accuracy of for example 10 µm so as to highly precisely define the outline of the remaining part of the poorly adhesive structure 102. By selectively removing only excessive material of the poorly adhesive structure 102 at its laterally exterior edges, it is possible to precisely define lateral limits 110 of the remaining poorly adhesive structure 102 with significantly higher accuracy than possible with the printing process described referring to FIG. 2. Thus, the laser trimming process removes part of the poorly adhesive structure 102 at both opposing sides thereof shown in FIG. 3, and preferably along an entire circumference of, the poorly adhesive structure 102. Hence, the entire outline of the remaining laser trimmed poorly adhesive structure 102 may be defined with high spatial precision.

Highly advantageously, laser trimming accuracy can be as good as 10 µm, or even less. After constructing the PCB (printed circuit board) stack 104, laser cutting alignment fiducials may be skived on the same layer structures 106, 108 as the cavity 114 (see FIG. 6) to be formed. This helps to reduce the bottom opening diameter and any related residue risk, as described below. By the described process, it is possible to completely remove release ink from a surrounding of the region in which the cavity 114 shall be formed. Trimming release ink by laser processing may improve registration.

Now referring to a detail 130 of FIG. 3, trimming of the poorly adhesive structure 102 for refining accuracy of its lateral limits may also be accomplished by a lithography and etching process. Also, with lithography and etching, spatial limits of a poorly adhesive structure 102 may be defined with better accuracy than achievable with the printing process. For this purpose, a photoresist layer may be formed on the structure of FIG. 2 and may be patterned by irradiation with light and subsequent development of the photoresist. Thereby, a patterned mask 116 (which may also be denoted as photomask) is obtained on a desired part of the poorly adhesive structure 102 and on part of the stack 104, whereas excessive parts of the poorly adhesive structure 102 to be removed may remain exposed (i.e., not covered by patterned mask 116). Thereafter, the exposed part of the poorly adhesive structure 102 may be selectively removed by etching through recesses 170 in the mask 116, for instance by dry etching or by wet etching.

Although the lithographic process described referring to reference sign 130 may also improve the spatial accuracy of the poorly adhesive structure 102, the laser trimming process may be improved due to its simplicity and excellent spatial accuracy.

Figure 4:
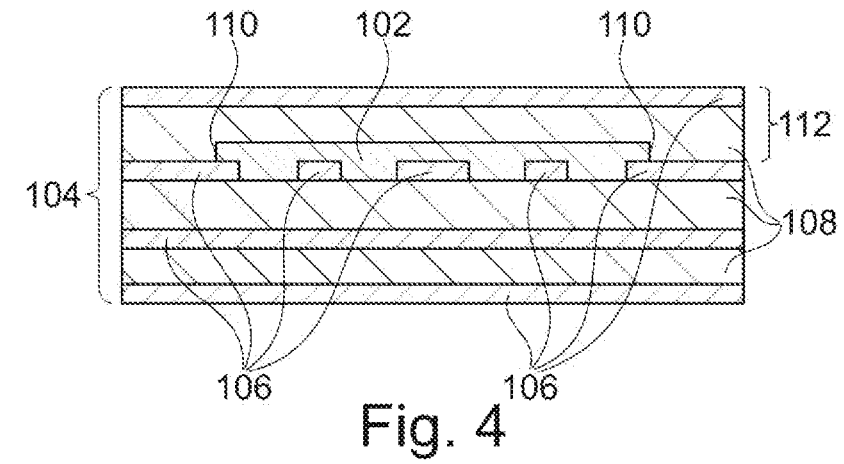

Referring to FIG. 4, a further build-up may be formed both on the remaining poorly adhesive structure 102 and on a surrounding surface of the stack 104. For this purpose, further layer structures 112 (which may comprise one or more further electrically conductive layer structures 106, such as copper foils, and/or one or more further electrically insulating layer structures 108, such as prepreg or resin sheets) are attached to the stack 104 and to the trimmed poorly adhesive structure 102 by lamination, i.e., the application of heat and/or pressure. Thus, layer build-up of the PCB may be continued after trimming up to a desired height and in accordance with a desired height of the cavity 114 to be formed.

Referring to FIG. 5, a portion of the material of the further layer structures 112 above the trimmed poorly adhesive structure 102 may then be cut out for subsequent removal by laser cutting. More specifically, a laser beam of a laser source (similar as indicated by reference signs 126, 128 shown in FIG. 3) may cut a circumferentially closed vertical trench 132 in the further layer structures 112, wherein the vertical trench 132 extends up to the trimmed poorly adhesive structure 102. More specifically, the vertical trench 132 may be formed by laser cutting in such a way that it exposes the trimmed lateral limits 110 of the poorly adhesive structure 102. Descriptively speaking, the laser beam removes material of the further layer structures 108 in a region corresponding to the trench 132 by a high energy impact. Highly advantageously, an electrically conductive layer structure 106 of the stack 104 at a bottom side of the poorly adhesive structure 102 is used as a circumferential stop layer during the laser cutting. The copper material of said electrically conductive layer structure 106 is much more resistant against laser cutting than the dielectric material of the electrically insulating layer structures 108 above and beneath the poorly adhesive structure 102. For this reason, it is advantageous that an exterior perimeter of a bottom 120 of the cavity 114 is delimited by said electrically conductive layer structure 106 of the stack 104 to thereby precisely define a bottom end of the trench 132.

Preferably, the laser beam used for laser cutting trench 132 may be pulsed and may be most preferably a picosecond laser or a femtosecond laser. It has turned out that this kind of cutting the stack 104 provides excellent spatial accuracy and hence formation of trench 132 with very low tolerances and without structural artefacts.

Highly advantageously, the same registration fiducials or alignment marks may be used for registration of the respective laser beam for trimming the poorly adhesive structure 102 and for registration for forming the trench 132. As a consequence, position and spatial extension of the cavity 114 formed according to FIG. 6 may be defined with high accuracy. The accuracy may be in particular significantly improved compared to a scenario in which different registration fiducials are used for laser trimming and laser cutting, because in the latter case tolerances are said different registration fiducials may contribute independently to the overall tolerance.

Referring to FIG. 6, cavity 114 may then be formed in the stack 104 by removing a cap-shaped material piece 134 of the further layer structure 112 above the poorly adhesive structure 102. Hence, a cap removal process may be executed according to FIG. 6. Said piece 134 is circumferentially separated from the rest of the stack 104 by the cut trench 132 and is easily separable from the rest of the stack 104 at the bottom side due to the non-adhesive property between the poorly adhesive structure 102 and material of the layer structures 106, 108. Thus, piece 134 can be simply taken out from the rest of the stack 104, so that a blind hole-type or recess-type cavity 114 remains.

In view of the excellent spatial accuracy of the formed cavity 114, the cavity 114 may be formed in the stack 104 without undercut 122 or with only very small undercut 122 along an entire circumference of a bottom 120 of the cavity 114. Advantageously, the cavity 114 may be formed without undercut 122 or with a spatially strictly limited undercut 122 (not more than 5 μm and preferably not more than 2 μm in a horizontal direction) along an entire circumference of a bottom 120 of the cavity 114. Such an undercut 122 is indicated, for purposes of comparison, in FIG. 7 (see also detail 137). An excessive undercut 122 (for instance having a spatial extension of 10 μm or more in a horizontal direction) may be created unintentionally if the lateral extension of the poorly adhesive structure 102 is spatially poorly defined, in particular in relation to the laser cut for forming trench 132. In view of the trimming of the poorly adhesive structure 102 by laser processing according to FIG. 3, such an inaccuracy can be reliably prevented. Advantageously, omission of an excessive undercut 122 according to an exemplary embodiment of the invention may prevent undesired effects such as delamination or reduction of the mechanical integrity of the component carrier 100 being presently manufactured.

However, a very small and strictly spatially limited overhang 122 of the poorly adhesive structure 102 (such as a release ink) may maintain and may be even advantageous after trimming. This overhang 122 of more than zero and not more than 5 μm, preferably not more than 2 μm, may ensure that the laser process during cap removal (i.e., during removal of cap-shaped material piece 134) hits the poorly adhesive structure 102 (i.e., not the copper only) to remove a very small amount of release ink (having a horizontally extension of not more than 5 μm and preferably of not more than 2 μm) which may be still present on the circumference of the cavity 114, or along part thereof.

Now referring to details 136 and 138, the described method leads to a first roughness Rz (denoted as "Rz1") of the exposed electrically conductive layer structure 106 along a circumference of a bottom surface of the cavity 114 which is lower than a second roughness Rz (denoted as "Rz2") of the exposed electrically conductive layer structure 106 in a central portion of the bottom surface of the cavity 114, i.e., Rz2>Rz1. The reason for this is that, contrary to the center portion, exposed copper along the circumference may be at least partially melted during laser trimming for adjusting the spatial extension of the poorly adhesive structure 102 and/or laser cutting for forming trench 132, in particular when serving as a laser stop layer. Wherein said temporarily melted copper material then resolidifies, roughness at its exposed top side may become smaller than roughness of the original copper surface of a copper foil or the like used for creating said electrically conductive layer structure 106. As a result, roughness in the region 136 is higher than roughness in the region 138, which is a fingerprint of the described manufacturing method. Hence, laser trimming and/or laser cutting may locally reduce the roughness Rz or Ra of the copper surface being melted by laser trimming and/or laser cutting. Descriptively speaking, an impact of laser processing on the copper surface may be a modification of the surface morphology, which may lead to surface smoothening.

FIG. 7 illustrates a component carrier 100 according to an exemplary embodiment of the invention obtained by the described manufacturing process. The component carrier 100 according to FIG. 7 is provided with a cavity 114 on its top side.

In order to obtain the component carrier 100 according to FIG. 7 based on the structure shown in FIG. 6, the now exposed poorly adhesive structure 102 may be entirely removed after forming the cavity 114. This can be accomplished for example by etching. Thus, it may be possible to strip the release layer so that the readily manufactured component carrier 100 does not include any release ink. This may ensure that the mechanical integrity and intra-layer adhesion of the readily manufactured component carrier 100 is high, and that delamination may be reliably prevented.

Alternatively, the bottom 120 of the cavity 114 may remain covered with the poorly adhesive structure 102 in a readily manufactured component carrier 100 (not shown).

In one embodiment, the cavity 114 may simply remain open, i.e., may be an exterior accessible recess. In other embodiments, a top side of the cavity 114 may be closed for forming a hollow space in an interior of the component carrier 100. For example, such a hollow internal space may be configured as a hollow waveguide for high-frequency applications. Further alternatively, such an internal space configured as a waveguide may also be filled with a dielectric material (having low DK properties for low loss RF applications).

Further alternatively, and as shown in FIG. 7, it is also possible to embed a component 124 in the formed cavity 114. In the shown embodiment, component 124 is an electronic component having a semiconductor body 140 with one or more integrated circuit elements (such as a field-effect transistor or a diode) being monolithically integrated therein, and having one or more electrically conductive pads 142 for establishing an electrically conductive connection between the electronic component 124 and electrically conductive layer structure 106 at the bottom of the cavity 114. For this purpose, the component 124 may be assembled into the cavity 114 and may be connected to the exposed electrically conductive layer structure 106 at the bottom of the cavity 114 for instance by soldering or by an electrically conductive glue. Although not shown, the embedded component 124 may be then glued in place in the cavity 114, for instance by flowable adhesive or by laminating a resin or prepreg sheet on top.

When configured as high-frequency component configured for RF (radio frequency) applications, the embedded component 124 may benefit from the precisely defined limits of the cavity 114 as well as from the smooth sidewalls of the cavity 114 being the consequence of its formation by laser cutting. Descriptively speaking, the skin effect will allow to obtain only very small RF losses when a high-frequency signal propagates along a trajectory comprising such a smooth sidewall.

As an alternative to the use of the cavity 114 for embedding a high-frequency component 124 therein, it may be possible to keep the cavity 114 open (or fill it with a dielectric material) and configure it as a waveguide for guiding RF signals. Advantageously, the skin effect will allow to keep RF losses very small when a high-frequency signal is guided in such an RF waveguide thanks to the smooth sidewalls of cavity 114 defined by laser cutting.

The illustrated component carrier 100 may be configured as a plate-shaped laminate-type printed circuit board (PCB). Thus, the component carrier 100 shown in FIG. 7 may be highly compact in a vertical direction.

Again referring to FIG. 7, the obtained component carrier 100 comprises stack 104 composed of the electrically conductive layer structures 106 and the electrically insulating layer structures 108. The cavity 114 formed in the stack 104 is advantageously free of any undercut 122 along an entire circumference of bottom 120 of the cavity 114. Roughness Rz along a circumference of the bottom surface of the cavity 114 is lower than roughness Rz in the central portion of the bottom surface of the cavity 114. The bottom 120 of the cavity 114 is partially delimited by one of the electrically conductive layer structures 106 and is partially delimited by one of the electrically insulating layer structures 108 of the stack 104.

FIG. 8 to FIG. 11 illustrate cross-sectional views of structures obtained during carrying out a method of manufacturing a component carrier 100 according to another exemplary embodiment of the invention.

Figure 8:
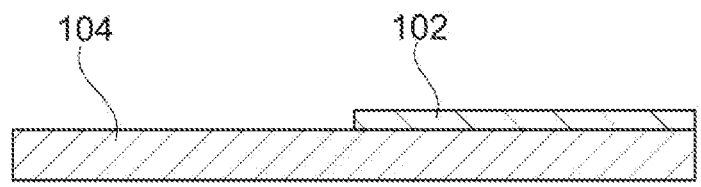
FIG. 8, FIG. 9, FIG. 10, and FIG. 11 illustrate cross-sectional views of structures obtained during carrying out a method of manufacturing a component carrier according to another exemplary embodiment of the invention.

Referring to FIG. 8, release ink is applied as a preform of a poorly adhesive structure 102 on a laminated layer stack 104, for instance by screen printing. In view of the high tolerance of such an application technique, a spatial extension of the applied release ink may be unspecific or inaccurate and may strongly deviate from a target specification.

Figure 9:
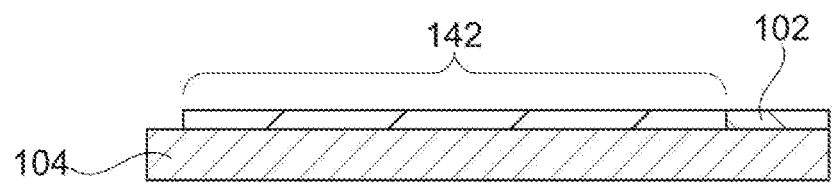

Referring to FIG. 9, the spatial extension of the applied poorly adhesive structure 102 may be brought in accordance with a specification by selectively removing part of the poorly adhesive structure 102. This may be accomplished advantageously by laser brushing or trimming. For instance, a laser beam may be moved over a spatial range 142 (of for example 300 µm width) for this purpose.

Figure 10:
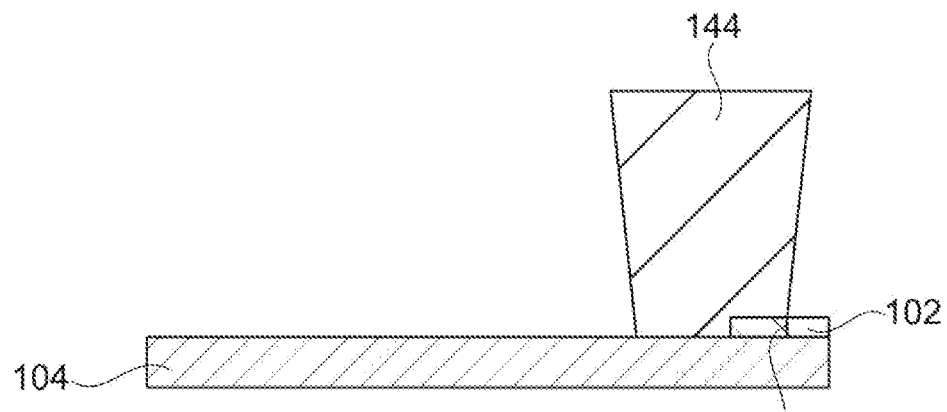

FIG. 10 illustrates a subsequent laser cutting process for forming a trench, compare reference sign 132 in FIG. 5, by a laser beam 144. For example, a minimum bottom opening of for instance 30 µm may be created accordingly.

In view of the process according to FIG. 8 to FIG. 10, it is possible to eliminate any undesired undercut 122 which may be conventionally caused by the low spatial resolution of a screen-printing application technique.

Figure 11:
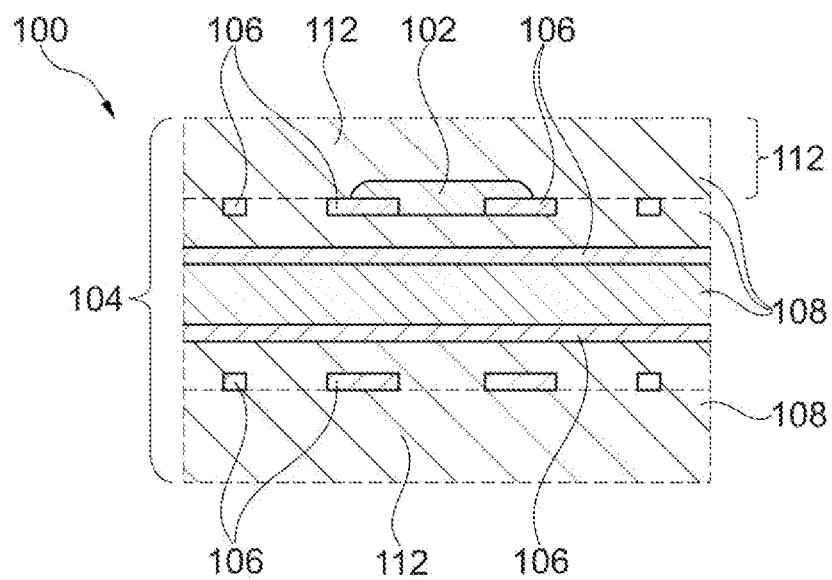

Referring to FIG. 11, an obtained result may then be made subject of a further lamination process for attaching one or more further layer structures 112.

Based on the obtained structure according to FIG. 11, the process may then be continued in accordance with FIG. 5 to FIG. 7.

Figure 12:
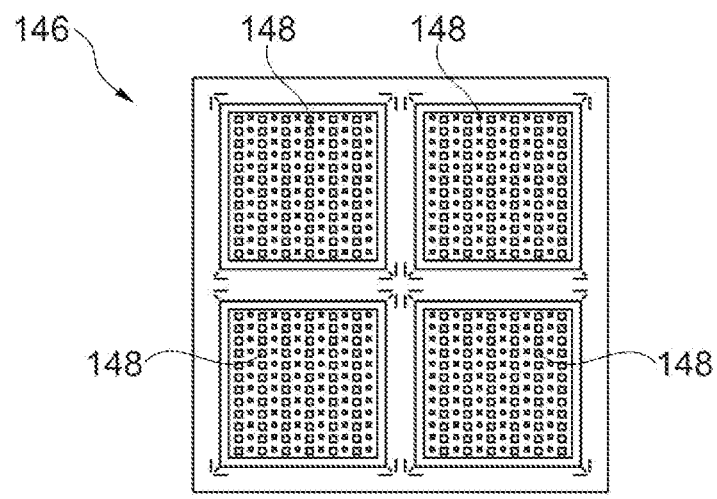
FIG. 12, FIG. 13, and FIG. 14 illustrate various plan views of a panel, and parts thereof, used for manufacturing component carriers according to an exemplary embodiment of the invention.
Figure 13:
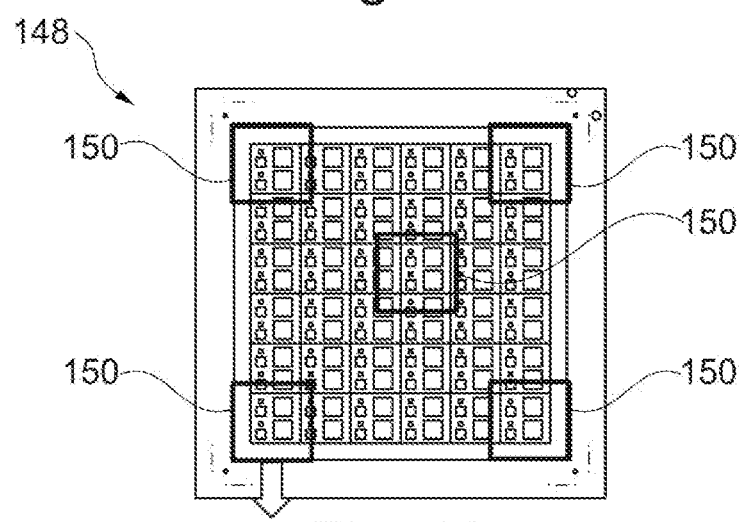
Figure 14:
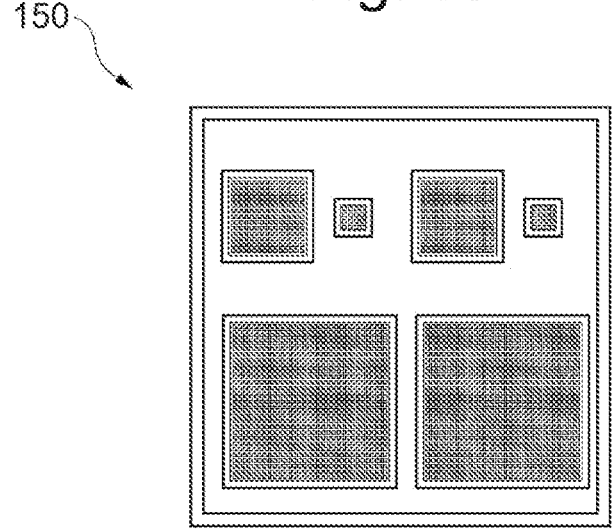

FIG. 12 to FIG. 14 illustrate various plan views of a panel 146, and parts thereof, used for manufacturing component carriers 100 according to an exemplary embodiment of the invention.

Referring to FIG. 12, a plan view of panel 146 is shown used for manufacturing a plurality of printed circuit board (PCB)-type component carriers 100 on panel level. For example, panel 146 may have dimensions of 18×18 inch$^2$.

The illustrated panel 146 is composed of four quarter panels 148. FIG. 13 shows one of these quarter panels 148. Five locations 150 of said quarter panel 148 are indicated as regions in which release ink trimming according to an exemplary embodiment of the invention can be carried out in the described example. Referring to FIG. 14, one of the locations 150 or regions mentioned according to FIG. 13 is shown in detail.

FIG. 15 to FIG. 18 illustrate various plan views of parts of a panel used for manufacturing component carriers 100 according to an exemplary embodiment of the invention.

Figure 15:
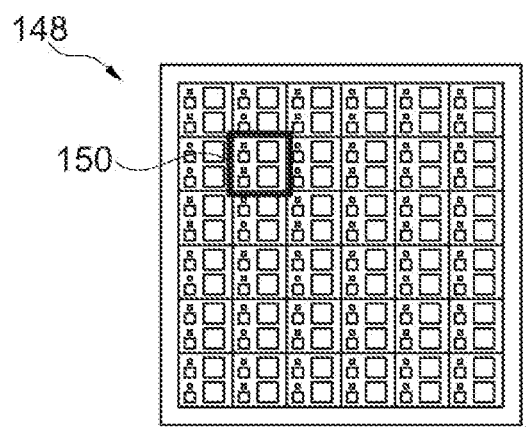
Figure 16:
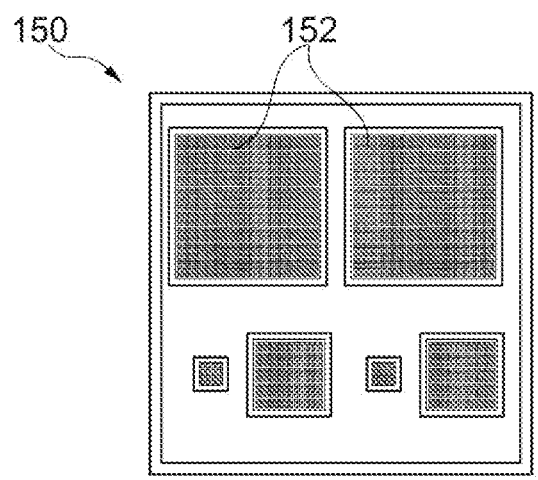
Figure 17:
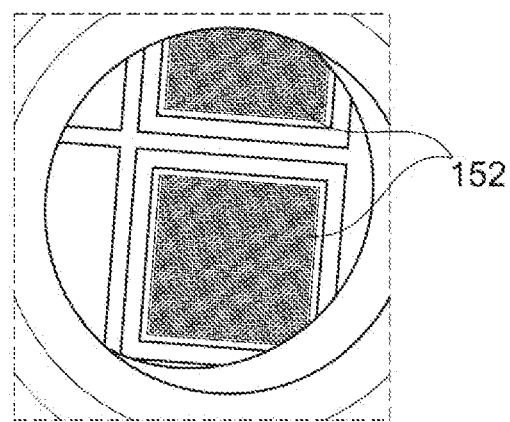

FIG. 15 shows a quarter panel 148 with individual locations 150. FIG. 16 shows such a location 150 in further detail including respective sub-portions 152. FIG. 17 shows a zoomed portion of FIG. 16 including the sub-portions 152. Each of FIG. 15 to FIG. 17 relates to a respective portion of the panel after screen printing and release ink curing.

Referring to FIG. 18, a further detailed view of a sub-portion 152 of FIG. 15 to FIG. 17 is illustrated. FIG. 18 relates to a scenario after laser trimming. As shown in detail 154, a copper surface is free of a release film. As shown in detail 156, no residue of release ink can be seen on another copper surface. Detail 158 indicates a trimmed edge which shows well-defined spatial properties. In an experimentally captured image corresponding to FIG. 18, different values of the copper surface roughness may be seen visually. A brighter contour in a horizontally extending portion of a substantially L-shaped electrically conductive layer structure 106 adjacent to poorly adhesive structure 102 is related to the position of the laser during cavity formation. In this area, the copper surface roughness is locally decreased, and the area appears to be shinier and brighter in an experimentally captured image than the rest of the copper surface.

FIG. 19 illustrates a part of a panel and a detail thereof used for manufacturing component carriers 100 according to an exemplary embodiment of the invention. More specifically, FIG. 19 shows a quarter panel 148 comprising different locations or regions 160, 162. Region 160 has been treated by laser trimming according to an exemplary embodiment of the invention. Region 162 has not been treated by laser trimming, FIG. 20 illustrates a cross-sectional view of a component carrier 100 according to exemplary embodiment of the invention, and in particular illustrates a detail of region 160. FIG. 21 illustrates a conventional component carrier, and in particular illustrates a detail of region 162.

Without laser trimming, compare FIG. 21, an undesired release ink residue can be seen under a dielectric layer structure 112 as an undercut 122 of for example 10 µm.

With laser trimming, compare FIG. 20, no such undesired undercut 122 is visible. In other embodiments of the invention, a small undercut 122 of for example not more than 5 µm and preferably of not more than 2 µm, most preferably of below 1 µm, may remain. Hence, by removing an excessive amount of release ink at an edge may increase reliability of the obtained component carrier 100. Advantageously, no foreign material in form of the poorly adhesive structure 102 with weak adhesion remains in the manufactured component carrier 100. Consequently, delamination may be suppressed and better compliance with design rules may be achieved.

Figure 22:
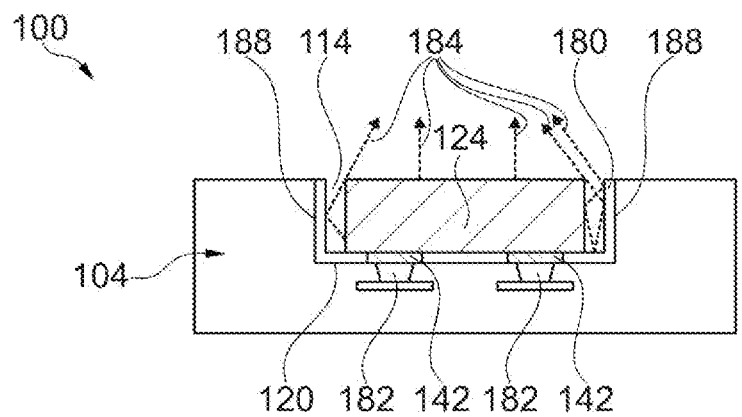
FIG. 22 illustrates a cross-sectional view of a component carrier with a functional coating of a cavity according to an exemplary embodiment of the invention.

FIG. 22 illustrates a cross-sectional view of a component carrier 100 with a functional coating 180 lining a cavity 114 according to an exemplary embodiment of the invention.

The component carrier 100 according to FIG. 22 comprises functional coating 180 coating a bottom 120 of the cavity 114 and side walls 188 of the cavity 114. For instance, said functional coating 118 may be an optically reflective coating which may be advantageous for optical applications (for example for reflecting and guiding light 184 in an interior of the cavity 114). The functional coating 180 surrounds a stack-internal part of an optical component 124 embedded in stack 104 so that light 184 emitted by embedded component 124 and propagating towards an interior of the stack 104 is reflected by the functional coating 180 so that a large portion of the light 184 propagates out of the component carrier 100.

Furthermore, one or more metal-filled vias 182 may be formed at the bottom 120 of the cavity 114 and may be coupled electrically and/or thermally with the embedded component 124, for example by pads 142 thereof. Thus, vias 182 below the cavity 114 can be manufactured for ensuring a proper heat management and/or for electrically contacting of the component 124. For example, the vias 182 may be formed by laser processing. Thereafter, the vias 182 may be filled with a metal such as copper by plating.

Figure 23:
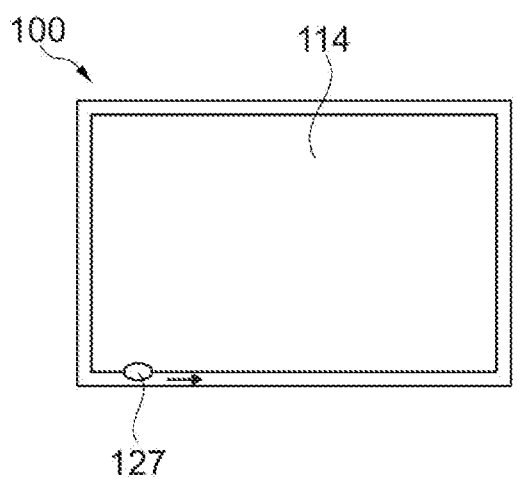
FIG. 23 illustrates a plan view of a cavity formed in a component carrier according to an exemplary embodiment of the invention.

FIG. 23 illustrates a plan view of a cavity 114 formed in a component carrier 100 according to an exemplary embodiment of the invention. For comparison purposes, FIG. 24 illustrates a plan view of a cavity 115 formed in a conventional component carrier 101.

Figure 24:
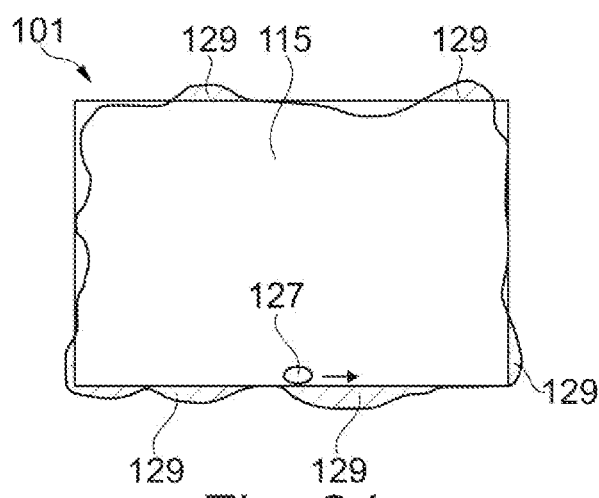
FIG. 24 illustrates a plan view of a cavity formed in a conventional component carrier.

FIG. 23 and FIG. 24 illustrate in more detail, how a cavity would look like, if excessive material of the poorly adhesive structure 102 (also denoted as release ink) is not removed prior to the manufacturing of the cavity. For this purpose, FIG. 23 illustrates a cavity 114 formed by laser cutting after removal of excessive material of the poorly adhesive structure 102 according to an exemplary embodiment of the invention. For comparison purposes, FIG. 24 illustrates a cavity 115 formed by laser cutting without prior removal of excessive material of the poorly adhesive structure 102. If the release ink is not removed prior to the laser cutting, ink will be present below a dielectric layer of a layer stack, see residues 129 of poorly adhesive structure 102 according to FIG. 24. However, it is not necessary that these residues 129 will be detectable within a cross section. This is related to the formation of the cavity 115 during laser cutting. During this process, the laser beam (see reference sign 127) will automatically remove part of the poorly adhesive structure 102. Some residues 129 out of the radius of the laser beam 127 will still remain in the build-up, but they cannot be seen in a cross section, as demonstrated by FIG. 24.

More specifically, FIG. 23 and FIG. 24 show a laser cutting process during formation of the cavity 114/115. An embodiment of the invention is shown in FIG. 23, whereas conventional cavity formation is shown in FIG. 24. Reference sign 127 and an arrow show the laser and its direction respectively. Forming cavity 115 without previously removing excessive material of the poorly adhesive structure 102 will lead to residues 129 further away from the sidewalls of the cavity 115, as shown in FIG. 24. Consequently, these residues 129 may not be detectable in a cross section, but without removing part of the release ink before cavity formation, such residues 129 may always stay inside the build-up. In contrast to this and as shown in FIG. 23, exemplary embodiments of the invention may guarantee not to have any residues 129 of the poorly adhesive structure 102 (in particular embodied as release layer)—see undercut 122 as described above—over all edges of the cavity 114.

Figure 25:
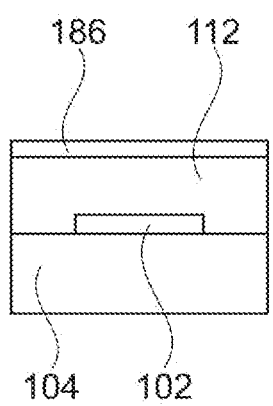
FIG. 25, FIG. 26, and FIG. 27 illustrate cross-sectional views of structures obtained during carrying out a method of manufacturing a component carrier, shown in FIG. 27, according to an exemplary embodiment of the invention.
Figure 26:
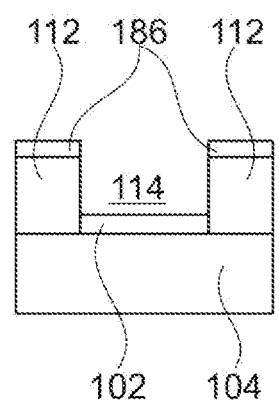
Figure 27:
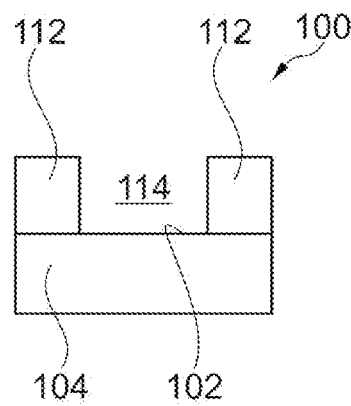

FIG. 25 to FIG. 27 illustrate cross-sectional views of structures obtained during carrying out a method of manufacturing a component carrier 100, shown in FIG. 27, according to another exemplary embodiment of the invention.

Referring to FIG. 25, a structure is shown which can be manufactured for example in a way as described above referring to FIG. 1 to FIG. 4. Thereafter, a temporary protection layer 186 may be formed on an upper main surface of the structure.

Referring to FIG. 26, cavity 114 is formed in the structure shown in FIG. 25 by laser cutting. During laser cutting, material removed from the structure shown in FIG. 25 is protected by the protection layer 186 from depositing on an upper main surface of the illustrated structure.

Referring to FIG. 27, the protection layer 186 is removed. Removal of the protection layer 186 may be accomplished before, after or simultaneously with the removal of the poorly adhesive structure 102.

With the processing according to FIG. 25 to FIG. 27, temporary protection layer 186 covering the surface of the PCB being manufactured may be formed. The protection layer 186 is applied onto the surface of the further layer structures 112 before the formation of the cavity 114. During forming the cavity 114, residues from the stack material to be removed by the laser will be accumulated on the exterior surface of the protection layer 186. As soon as the cavity 114 is formed, the protection layer 186 can be removed. With this manner, a cleaning process (for instance a desmear process) after formation of the cavity 114 may become dispensable.

Figure 28:
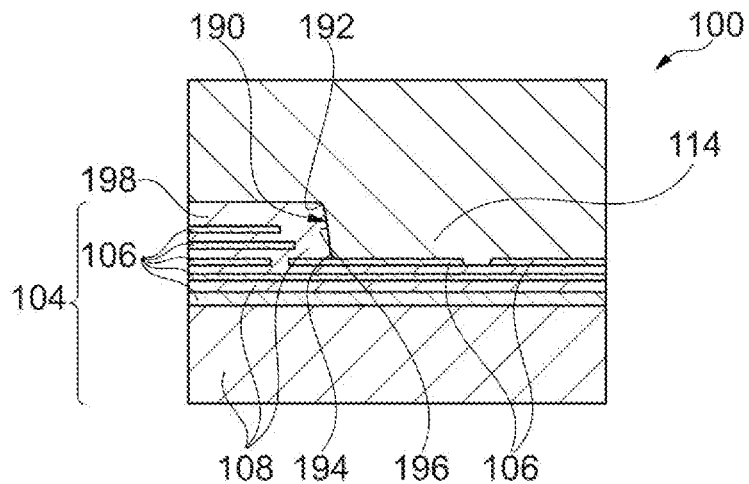
FIG. 28 illustrates a cross-sectional image of a manufactured component carrier with interior cavity according to an exemplary embodiment of the invention.
Figure 29:
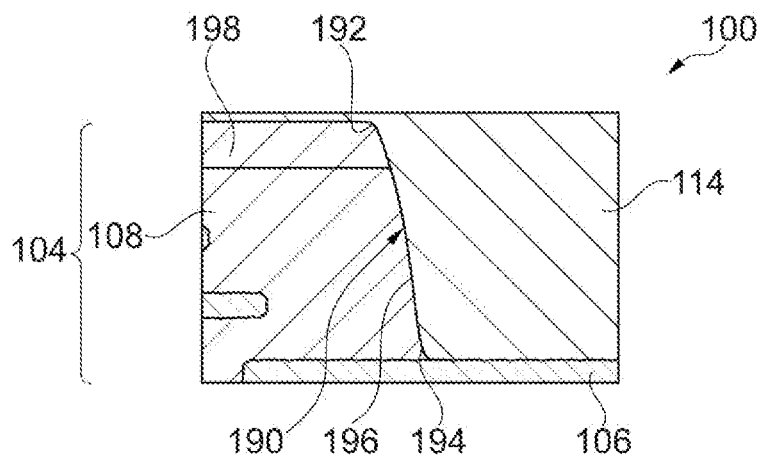
FIG. 29 shows a detail of FIG. 28.

FIG. 28 illustrates a cross-sectional image of a manufactured component carrier 100 with interior cavity 114 according to an exemplary embodiment of the invention. FIG. 29 shows a detail of FIG. 28, and FIG. 30 shows a detail of FIG. 29.

The illustrated component carrier 100 has sidewalls 190 of one or more electrically insulating layer structures 108 of stack 104 delimiting the cavity 114 which are substantially S-shaped, as best seen in FIG. 29. In other embodiments, said sidewalls 190 may be wave-shaped. As also best seen in FIG. 29, an upper end 192 of the sidewalls 190 of the electrically insulating layer structure(s) 108 delimiting the cavity 114 is curved outwardly. Referring specifically to FIG. 30, a lower end 194 of the sidewalls 190 of the electrically insulating layer structure(s) 108 delimiting the cavity 114 is tilted. A central part 196 of sidewalls 190 of said electrically insulating layer structure(s) 108 delimiting the cavity 114 tapers downwardly.

The described geometry can be obtained by carrying out the manufacturing processes, as described above, in particular laser cutting of cavity 114. Referring to an obtained geometry of the cavity edges, the cavity sidewall 190 is obtained with an S-shape or a wave-like edge due to the laser cutting process. The smooth curved—rather than exactly rectangular—geometry of the cavity 114 and its delimiting sidewalls 190 functions as a buffer structure for buffering mechanical and thermal stress which may occur during manufacture and/or use of the component carrier 100. This may further suppress any tenancy of delamination and/or warpage.

Figure 30:
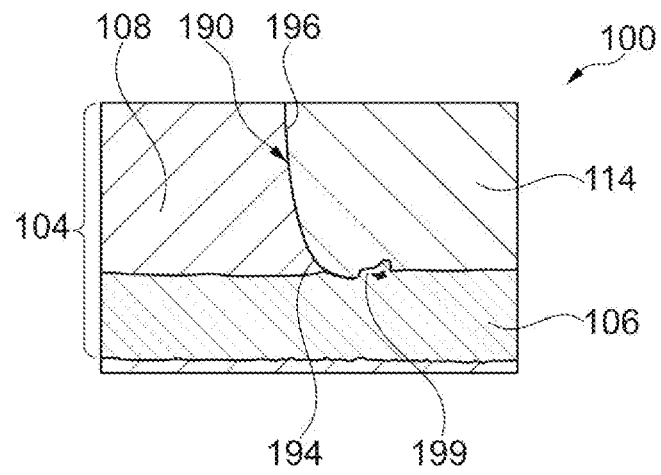
FIG. 30 shows a detail of FIG. 29.

In FIG. 28 to FIG. 30, a solder resist is shown with reference sign 198, and a surface finish is shown with reference sign 199.

Figure 31:
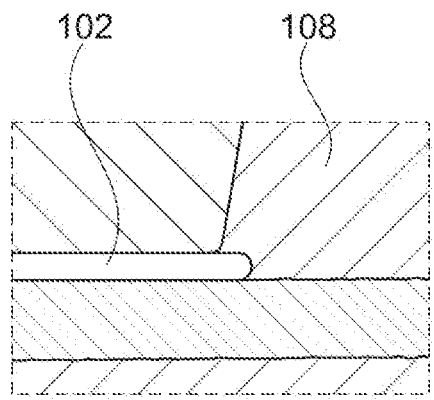
FIG. 31 shows a cross-sectional view of a portion of a component carrier during manufacture.
Figure 32:
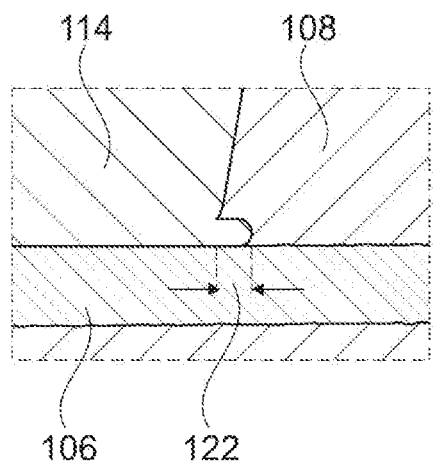
FIG. 32 shows a cross-sectional view of a corresponding portion of the readily manufactured component carrier according to an exemplary embodiment of the invention.
Figure 33:
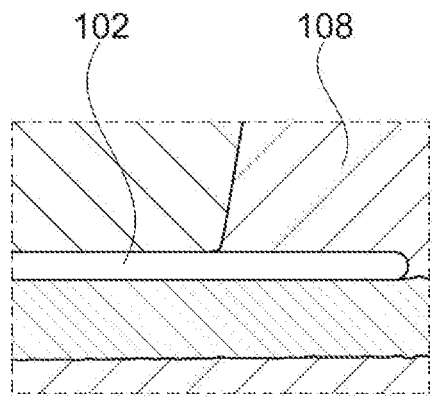
FIG. 33 shows a cross-sectional view of a portion of a component carrier during manufacture.
Figure 34:
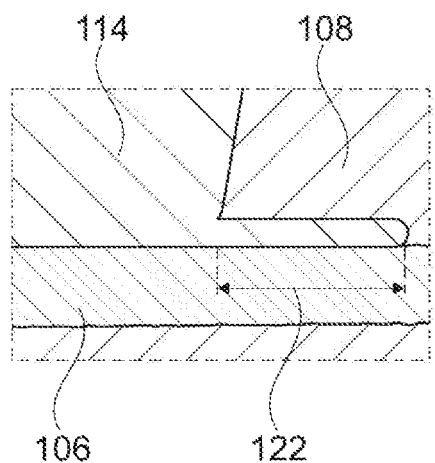
FIG. 34 shows a cross-sectional view of a corresponding portion of the readily manufactured component carrier according to an exemplary embodiment of the invention.

FIG. 31 shows a cross-sectional view of a portion of a component carrier 100 during manufacture, and FIG. 32 shows a cross-sectional view of a corresponding portion of the readily manufactured component carrier 100 according to an exemplary embodiment of the invention. FIG. 33 shows a cross-sectional view of a portion of a component carrier 100 during manufacture, and FIG. 34 shows a cross-sectional view of a corresponding portion of the readily manufactured component carrier 100 according to an exemplary embodiment of the invention. As can be taken from FIG. 31 to FIG. 34, a manufacturing method according to an exemplary embodiment of the invention may comprise adjusting a size and/or a shape of a lateral undercut 122 at a bottom of the cavity 114 by correspondingly adjusting the process of removing part of the poorly adhesive structure 102. According to FIG. 33 and FIG. 34, a larger undercut 122 is formed as compared to the embodiment of FIG. 31 and FIG. 32.

As shown in FIG. 31 to FIG. 34, the ink trimming can be also used to define a depth of the undercut 122 caused by released ink application. In FIG. 31 and FIG. 33, a release-ink controlled application from smaller undercut to larger undercut is shown. FIG. 32 and FIG. 34 illustrate post release ink stripping from smaller undercut 122 to larger undercut 122.

Thus, laser trimming may be used for adjusting a value of the under-cut 122.

It should be noted that the term "comprising" does not exclude other elements or steps and the use of articles "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A method of manufacturing a component carrier, the method comprising:
   forming a poorly adhesive structure on at least one layer structure;
   thereafter removing part of the poorly adhesive structure to thereby define a lateral limit of the poorly adhesive structure;
   thereafter attaching at least one further layer structure to the at least one layer structure and to the poorly adhesive structure; and
   forming a cavity by removing material of the at least one further layer structure above the poorly adhesive structure;
   wherein removing part of the poorly adhesive structure comprises removing part of the poorly adhesive structure at two opposing sides of the poorly adhesive structure.

2. The method according to claim 1, wherein the method comprises forming the poorly adhesive structure on a stack, the stack comprising at least one electrically conductive layer structure and at least one electrically insulating layer structure.

3. The method according to claim 1, wherein the method comprises forming the poorly adhesive structure by at least one of the group consisting of coating, laminating, and printing.

4. The method according to claim 1, further comprising:
   forming a functional coating on at least part of a surface which delimits the cavity.

5. The method according to claim 1, further comprising:
   removing the part of the poorly adhesive structure by laser trimming.

6. The method according to claim 1, further comprising:
   removing the part of the poorly adhesive structure by a mask on part of the poorly adhesive structure and on part of the at least one layer structure, and subsequently etching part of the poorly adhesive structure through one or more recesses in the mask.

7. The method according to claim 1, wherein the method comprises forming the cavity without an undercut or without an undercut exceeding 5 μm along an entire circumference of a bottom of the cavity.

8. The method according to claim 1, wherein the method comprises removing material of the at least one further layer structure by laser cutting.

9. The method according to claim 8, wherein the method comprises using at least one electrically conductive layer structure of the at least one layer structure as a stop layer during the laser cutting.

10. The method according to claim 1, wherein the method comprises at least partially delimiting a bottom of the cavity by at least one electrically conductive layer structure of the at least one layer structure.

11. The method according to claim 1, comprising at least one of the following features:
    wherein the method comprises removing the poorly adhesive structure after forming the cavity;
    wherein the method comprises using the same registration fiducials for registration for removing part of the poorly adhesive structure, and for registration for separating material of the at least one further layer structure to be removed.

12. The method according to claim 1, wherein the method comprises removing the material in form of a material piece by forming a circumferential trench in the at least one further layer structure around the material piece which is delimited at a bottom side by the poorly adhesive structure.

13. The method according to claim 1, wherein the method comprises adjusting a roughness Rz of a metallic surface along at least part of a circumference of a bottom surface of the cavity to be lower than a roughness Rz of a metallic surface in a central portion of the bottom surface of the cavity.

14. The method according to claim 1, wherein the method comprises forming the poorly adhesive structure as a poorly adhesive layer with a planar upper surface on the at least one layer structure.

15. The method according to claim 1, wherein the method comprises embedding a component in the formed cavity.

16. The method according to claim 1, wherein the method comprises:
    forming a protection layer on the at least one further layer structure before forming the cavity; and
    after forming the cavity, removing the entire protection layer from the at least one further layer structure.

17. The method according to claim 1, wherein the method comprises adjusting a size and/or a shape of a lateral undercut along at least part of a circumference of a bottom of the cavity by correspondingly adjusting the process of removing part of the poorly adhesive structure.

18. A method of manufacturing a component carrier, the method comprising:
    forming a poorly adhesive structure on at least one layer structure;
    thereafter removing part of the poorly adhesive structure to thereby define a lateral limit of the poorly adhesive structure;
    thereafter attaching at least one further layer structure to the at least one layer structure and to the poorly adhesive structure; and
    forming a cavity by removing material of the at least one further layer structure above the poorly adhesive structure, further comprising:

forming a functional coating on at least part of a surface which delimits the cavity.

19. A method of manufacturing a component carrier, the method comprising:
- forming a poorly adhesive structure on at least one layer structure;
- thereafter removing part of the poorly adhesive structure to thereby define a lateral limit of the poorly adhesive structure;
- thereafter attaching at least one further layer structure to the at least one layer structure and to the poorly adhesive structure; and
- forming a cavity by removing material of the at least one further layer structure above the poorly adhesive structure,
- wherein the method comprises adjusting a roughness Rz of a metallic surface along at least part of a circumference of a bottom surface of the cavity to be lower than a roughness Rz of a metallic surface in a central portion of the bottom surface of the cavity.

* * * * *